United States Patent
Lu et al.

(10) Patent No.: US 8,340,192 B2
(45) Date of Patent: Dec. 25, 2012

(54) WYNER-ZIV CODING WITH MULTIPLE SIDE INFORMATION

(75) Inventors: Yan Lu, Beijing (CN); Feng Wu, Beijing (CN); Mei Guo, Harbin (CN); Shipeng Li, Redmond, WA (US)

(73) Assignee: Microsoft Corporation, Redmond, WA (US)

( * ) Notice: Subject to any disclaimer, the term of this patent is extended or adjusted under 35 U.S.C. 154(b) by 1153 days.

(21) Appl. No.: 12/047,317

(22) Filed: Mar. 12, 2008

(65) Prior Publication Data

US 2008/0291065 A1  Nov. 27, 2008

Related U.S. Application Data

(60) Provisional application No. 60/940,360, filed on May 25, 2007.

(51) Int. Cl.
*H04N 11/04* (2006.01)
(52) U.S. Cl. .................................. 375/240.18
(58) Field of Classification Search ............. 375/240.18, 375/265
See application file for complete search history.

(56) References Cited

U.S. PATENT DOCUMENTS

| | | |
|---|---|---|
| 5,144,423 A | 9/1992 | Knauer et al. |
| 5,412,741 A | 5/1995 | Shapiro |
| 5,719,632 A | 2/1998 | Hoang et al. |
| 5,818,536 A | 10/1998 | Morris et al. |
| 5,854,658 A | 12/1998 | Uz et al. |
| 5,862,450 A | 1/1999 | Mandal et al. |
| 6,018,303 A | 1/2000 | Sadeh |
| 6,122,320 A | 9/2000 | Bellifemine et al. |
| 6,157,746 A | 12/2000 | Sodagar et al. |
| 6,275,532 B1 | 8/2001 | Hibi et al. |
| 6,289,049 B1 | 9/2001 | Kim et al. |
| 6,498,810 B1 | 12/2002 | Kim et al. |
| 6,526,097 B1 | 2/2003 | Sethuraman et al. |
| 6,542,549 B1 | 4/2003 | Tan et al. |
| 6,628,712 B1 | 9/2003 | Le Maguet |
| 6,717,990 B1 | 4/2004 | Abousleman |
| 6,735,249 B1 | 5/2004 | Karczewicz et al. |
| 6,920,175 B2 | 7/2005 | Karczewicz et al. |

(Continued)

FOREIGN PATENT DOCUMENTS

EP       0971542       1/2000

(Continued)

OTHER PUBLICATIONS

Aaron et al., "Compression with Side Information Using Turbo Codes", Proc. of Data Compression Conf (DCC 02), Apr. 2002, Utah, 10 pgs.

(Continued)

*Primary Examiner* — Man Phan
*Assistant Examiner* — Kevin Lee
(74) *Attorney, Agent, or Firm* — Lee & Hayes, PLLC

(57) ABSTRACT

A Wyner-Ziv coding scheme jointly utilizes multiple side information at the decoder is described. A new probability model is introduced based on an extended turbo decoding trellis, so that the transitional probability is calculated from the probabilities conditioned on multiple side information. The proposed scheme handles multiple side information in a multi-dimensional manner to potentially achieve coding performance better than either selecting one side information or generating a single side information by averaging several side information. When the decoder receives multiple streams of parity bits, the conditional probabilities on the parity bits from the multiple streams all contribute in turbo decoding. The errors existing in some of the streams can be automatically eliminated during the decoding process.

20 Claims, 8 Drawing Sheets

U.S. PATENT DOCUMENTS

| | | |
|---|---|---|
| 6,947,486 B2 | 9/2005 | Akhan et al. |
| 7,003,035 B2 | 2/2006 | Tourapis et al. |
| 7,031,389 B2 | 4/2006 | Guevorkian et al. |
| 7,233,269 B1 | 6/2007 | Chen et al. |
| 7,256,716 B2 | 8/2007 | Liu et al. |
| 7,418,037 B1 | 8/2008 | Nie et al. |
| 2003/0123540 A1 | 7/2003 | Zhong et al. |
| 2003/0151753 A1 | 8/2003 | Li et al. |
| 2003/0156644 A1 | 8/2003 | Song et al. |
| 2004/0039571 A1 | 2/2004 | Bruekers et al. |
| 2004/0114684 A1 | 6/2004 | Karczewicz et al. |
| 2004/0172478 A1 | 9/2004 | Jacobs et al. |
| 2005/0013371 A1 | 1/2005 | Yim et al. |
| 2005/0024487 A1 | 2/2005 | Chen |
| 2005/0036550 A1 | 2/2005 | Koba et al. |
| 2005/0047508 A1 | 3/2005 | Ha et al. |
| 2005/0084014 A1 | 4/2005 | Wang et al. |
| 2005/0105815 A1 | 5/2005 | Zhang et al. |
| 2005/0201468 A1 | 9/2005 | Tsai et al. |
| 2005/0232360 A1 | 10/2005 | Byun, II |
| 2005/0268200 A1 | 12/2005 | Garudadri et al. |
| 2006/0008006 A1 | 1/2006 | Cha et al. |
| 2006/0062299 A1 | 3/2006 | Park et al. |
| 2006/0072662 A1 | 4/2006 | Tourapis et al. |
| 2006/0197686 A1 | 9/2006 | Liu et al. |
| 2006/0197690 A1 | 9/2006 | Liu et al. |
| 2006/0200733 A1 | 9/2006 | Stankovic et al. |
| 2007/0013561 A1 | 1/2007 | Xu et al. |
| 2007/0014356 A1 | 1/2007 | Han et al. |
| 2007/0041652 A1 | 2/2007 | Budge et al. |
| 2007/0133690 A1 | 6/2007 | Xin et al. |
| 2007/0165717 A1 | 7/2007 | Ye |
| 2007/0217541 A1 | 9/2007 | Liu et al. |
| 2008/0189073 A1* | 8/2008 | Jagmohan et al. ............ 702/181 |
| 2008/0219351 A1* | 9/2008 | Kim et al. ................ 375/240.16 |

FOREIGN PATENT DOCUMENTS

| | | |
|---|---|---|
| WO | WO2005043882 A2 | 5/2005 |

OTHER PUBLICATIONS

Aaron, et al., "Towards Practical Wyner-Ziv Coding of Video Introduction," retrieved at <<http://www.hpl.hp.com/personal/Eric_Setton/Publications/AaronBarcelona2003.pdf>>, IEEE, 2003, 4 pgs.

Aaron, et al., "Transform-domain Wyner-Ziv Codec for Video", available at least as early as Jun. 4, 2007, at <<http://citeseer.ist.psu.edu/cache/papers/cs/31531/http:zSzzSzwww.stanford.eduzSz~bgirodzSzpdfszSzAaronVCIP04.pdf/transform-domain-wyner-ziv.pdf>>, Jan. 2004, 9 pgs.

Aaron et al., "Wyner-Ziv Coding of Motion Video", Proc. Asilomar Conf on Signals and Systems, California, Nov. 2002, 5 pgs.

Aaron, et al., "Wyner-Ziv Video Coding with Hash-Based Motion Compensation at the Receiver", 2004 International Conference on Image Processing, 2004, pp. 3097-3100.

Adikari, et al., "Side Information Improvement in DVC with Two Side Information Streams and 3D Motion Refinement," retrieved at <<http://ieeexplore.ieee.org/iel5/4232658/4232659/04232674.pdf?isnumber=4232659&prod=CNF&arnumber=4232674&arSt=32&ared=35&arAuthor=Adikari%2C+A.+B.+B.%3B+Fernando%2C+W.+A.+C.%3B+Weerakkody%2C+W.+A.+R.+J.&htry=1>>, IEEE, 2007, pp. 32-35.

Artigas, et al., "A Model-Based Enhanced Approach to Distributed Video Coding", Image Analysis for Multimedia Interactive Services, WIAMIS, Apr. 2005, 4 pgs.

Barron, et al., "The Duality Between Information Embedding and Source Coding with Side Information and Some Applications", available at least as early as Jun. 4, 2007, retrieved at <<http://allegro.mit.edu/pubs/posted/journal/2003-barron-chen-wornell-it.pdf>>, IEEE Transactions on Information Theory, vol. 49, No. 5, May 2003, pp. 1159-1180.

Berrou, et al., "Near Shannon Limit Error-Correcting Coding and Decoding:Turbo-Codes (1)", Proc. IEEE International Conference on Communications, Geneva, Switzerland, May 1993, pp. 1064-1070.

Chen et al., "Fast Integer Pel and Fractional Pel Motion Estimation for JVT", JVT-FO17, 6th Mtg, Japan, Dec. 2002, 14 pgs.

Chen et al, "Rate Control for Streaming Video over Wireless", Proc. INFOCOM 2004, Hong Kong, China, Mar. 2004, 6 pgs.

Dalai, et al., "Improving Turbo Codec Integration in Pixel-Domain Distributed Video Coding," available at least as early as Nov. 5, 2007, at <<http://www.discoverdvc.org/publications/IST/DLP_ICASSP06.pdf>>, 4 pgs.

Divsalar, et al., "Multiple Trellis Coded Modulation (MTCM)," IEEE Transactions on Communications, vol. 36, No. 4, Apr. 1988, pp. 410-419.

Fowler, et al., "Wavelet-Based Distributed Source Coding of Video", Proc. of European Signal Processing Conf, Turkey, 2005, 4 pgs.

Girod, et al., "Distributed Video Coding," Proc. IEEE Special Issue on Advances in Video Coding and Delivery, vol. 93, No. 1, Jan. 2005, 12 pgs.

Guo et al., "Dependency Modeling in Multiple Bit-Rate Video Streaming Using Wyner-Ziv Coding", ICIP, 2006, 5 pgs.

Guo et al, "Free Viewpoint Switching in Multi-View Video Streaming Using Wyner-Ziv Video Coding", SPIE Visual Communications and Image Processing, Jan. 2006, 8 pgs.

He et al., "Power-Rate-Distortion Analysis for Wireless Video Communication under Energy Constraints", IEEE Trans. on Circuits and Systems for Video Technology, vol. 15, May 2005, 13 pgs.

Karczewicz et al., "The SP- and SI-Frames Design for H.264/AVC", IEEE Trans. on Circuits and Systems for Video Technology, vol. 13, No. 7, Jul. 2003, 8 pgs.

Liu, et al., "Wyner-Ziv Video Coding Using LDPC Codes", IEEE, Jun. 2006, pp. 258-261.

Martucci et al., "Zerotree Entropy Coding of Wavelet Coefficients for Very Low Bit Rate Video", ICIP 1996, Switzerland, Sep. 1996, 4 pgs.

Pradhan et al., "Distributed Source Coding Using Syndromes (DISCUS): Design and Construction", IEEE Trans. on Information Theory, vol. 49, No. 3, Mar. 2003, 18 pgs.

Pu et al., "Joint Power-Distortion Optimization on Devices with MPEG-4 AVC/H.264 Codec", Proc. ICC 2006, Turkey, Jun. 2006, 6 pgs.

Puri et al., "PRISM: A New Robust Video Coding Architecture Based on Distributed Compression Principles", Proc. 40th Allerton Conf on Communication, Control, and Computing, Illinois, Oct. 2002, 10 pgs.

Puri et al., "PRISM: A Reversed Multimedia Coding Paradigm", IEEE Int. Conf. Image Processing, Spain, 2003, 4 pgs.

Rowitch et al., "On the Performance of Hybrid FEC/ARQ Systems Using Rate Compatible Punctured Turbo (RCPT) Codes", IEEE Trans. on Communications, vol. 48, No. 6, Jun. 2000, 12 pgs.

Slepian, et al., "Noiseless Coding of Correlated Information Sources", IEEE Transactions on Information Theory, vol. IT-19, No. 4, Jul. 1973, pp. 471-480.

"Source Coding", retrieved on Apr. 25, 2006 at <<http://www.irisa.fr/temics/research/coding.php>>, pp. 1-6.

Sun, et al., "Efficient and Flexible Drift-Free Video Bitstream Switching at Predictive Frames", vol. 1, IEEE, 2002, 4 pgs.

Sun, et al., "Seamless Switching of Scalable Video Bitstreams for Efficient Streaming", vol. 6, No. 2, IEEE, Transactions on Multimedia, Apr. 2004, pp. 291-303.

Sun et al., "The Improved SP Frame Coding Technique for the JVT Standard", Proc. IEEE ICIP 2003, vol. 3, Spain, Sep. 2003, 4 pgs.

Vleeschouwer, et al., "Motion Estimation for Low Power Video Devices", IEEE, 2001, pp. 953-956.

Wang, et al., "Wzs: Wyner-Ziv Scalable Predictive Video Coding", Proc. of Picture Coding Symposium, Dec. 2004, 6 pgs.

Westerlaken, et al., "Turbo-Code Based Wyner-Ziv Video Compression", available at least as early as Jun. 4, 2007, at <<http://ict.ewi.tudelft.nl/pub/ronald/RPWesterlakenWic2005.pdf>>, 8 pgs.

Wiegand et al., "Overview of the H.264/AVC Video Coding Standard", IEEE Trans. on Circuits and Systems for Video Technology, vol. 13, No. 7, Jul. 2003, 19 pgs.

Wu, et al., "Multiple Description Image Coding with Distributed Source Coding and Side Information", retrieved at <<http://www.merl.com/reports/docs/TR2004-147.pdf>>, Mitsubishi Electric Research Laboratories, Inc., Dec. 2004, 10 pgs.

Wyner, et al., "The Rate-Distortion Function for Source Coding with Side Information at the Decoder", IEEE Transactions on Information Theory, vol. IT-22, No. 1, Jan. 1976, pp. 1-10.

Yang et al., "A Framework for Fine-Granular Computational-Compleity Scalable Motion Estimation", Proc. IEEE, ISCAS 2005, vol. 6, May 2005, 4 pgs.

Yang, et al., "Adaptive Key Frame Selection Wyner-Ziv Video Coding", 2005 IEEE 7th Workshop on Multimedia Processing, Oct. 2005, 4 pgs.

Yang, et al., "Wyner-Ziv Coding Based on TCQ and LDPC Codes", vol. 1, IEEE, Nov. 9-12, 2003, pp. 825-829.

Zamir, et al., "Nested Linear/Lattice Codes for Structured Multiterminal Binning", IEEE Transactions on Information Theory, vol. 48, No. 6, Jun. 2002, pp. 1250-1276.

Zhao, et al., "Complexity Management for Video Encoders", International Multimedia Conference, 2002, 3 pgs.

Zhao, et al., "Computational Complexity Management of Motion Estimation in Video Encoders", Proceedings of the Data Compression Conference, IEEE, 2002, 1 page.

Final Office Action for U.S. Appl. No. 11/457,705, mailed on May 19, 2011, Yan Lu, "Encoding Visual Data with Computation Scheduling and Allocation", 13 pages.

Non-Final Office Action for U.S. Appl. No. 11/462,580, mailed on Jun. 21, 2011, Yan Lu, "Wyner-Ziv and Wavelet Video Coding", 18 pages.

Adikari, et all, "A Sequential Motion Compensation Refinement Technique for Distributed Video Coding of Wyner-Ziv Frames", Image Processing, 2006 IEEE International Conference: iEEE Cot. 2006, pp. 597-600.

Akikari, et al., "Wyner-Ziv Coding with Temporal and Spatial Correlations for Motion Video", Electrical and Computer Engineering, 2006, CCECE 2006, IEEE May 2006, pp. 1188-1191.

PCT International Search Report dated Oct. 20, 2008 from counterpart PCT Application No. PCT/US2008/064802, 3 pages.

Office Action for U.S. Appl. No. 11/462,580, mailed on Nov. 9, 2011, Yan Lu, "Wyner-Ziv and Wavelet Video Coding," 13 pages.

Office Action for U.S. Appl. No. 11/460,217, mailed on Feb. 22, 2012, Yan Lu, "Bitstream Switching in Multiple Bit-Rate Video Streaming Environments," 5 pages.

Office Action for U.S. Appl. No. 11/457,705, mailed on Apr. 18, 2012, Yan Lu, "Encoding Visual Data with Computation Scheduling and Allocation," 12 pages.

* cited by examiner

WYNER-ZIV CODING WITH MULTIPLE SIDE INFORMATION

CROSS-REFERENCE TO RELATED APPLICATIONS

This application claims priority benefit from U.S. Provisional Patent Application No. 60/940,360, filed on May 25, 2007, entitled "WYNER-ZIV CODING WITH MULTIPLE SIDE INFORMATION".

BACKGROUND

Traditional video coding algorithms such as H.264, MPEG-2, and MPEG-4 are suited for broadcast situations where extensive encoding is done using complicated equipment at the broadcast center while relatively simple decoding is done at the user end. The traditional video coding algorithms are less suitable for situations where the encoding is done at the user end which cannot host a computationally expensive encoder. Examples of such situations include wireless video sensors for surveillance, wireless PC cameras, mobile camera phones, and disposable video cameras. In particular, video sensor networks have been envisioned for many applications such as security surveillance, monitoring of disaster zones, domestic monitoring applications, and design of realistic entertainment systems involving multiple parties connected through the network. The rapidly growing video conferencing involving mobile communication of a large number of parties is another example.

The above listed situations require a distributed video coding system having a large number of low-complexity encoders, but one or a few high-complexity decoders. Wyner-Ziv coding of source video data are among the most promising distributed video coding solutions because it allows implementation of light-weight encoders and complex decoders. While Wyner-Ziv decoding is vastly more complex than conventional decoding, the corresponding Wyner-Ziv coding required may be simple.

Wyner-Ziv coding finds its origin in Slepian-Wolf theorem, which has suggested that the two correlated independent identically distributed (i.i.d) sequences X and Y can be encoded losslessly with the same rate as that of the joint encoding as long as the collaborative decoders are employed. Wyner and Ziv extended this theorem to the lossy coding of continuous-valued sources. According to Slepian-Wolf and Wyner-Ziv theorems, it is possible to exploit the correlation only at the decoder. For example, the temporal correlation in video sequences can be exploited by shifting motion estimation from the encoder to the decoder, and low-complexity video coding is thus made possible.

Moreover, owing to separate encoding and joint decoding, Wyner-Ziv bit stream can compensate for the mismatch between the encoder and the decoder, which is a key issue in a video coding system. Wyner-Ziv coding scheme is thus desirable in distributed video coding systems such as that involves mobile devices and wireless sensor networks. The main challenge of distributed video coding using Wyner-Ziv coding scheme is how to explore the correlation at the decoder.

Some practical Wyner-Ziv coding methods have been proposed for video coding in the past. In existing turbo-code based Wyner-Ziv video coding schemes performed in pixel domain, the Wyner-Ziv frame is encoded with a turbo encoder. The delivered parity bits are decoded jointly with temporal side information generated from the previously reconstructed adjacent frames. The temporal side information is obtained by interpolating the adjacent frames. Wyner-Ziv coding has also been further applied to transform domain such as discrete cosine transform (DCT) or wavelet. In particular, some high frequency DCT coefficients as hash words can be transmitted to the decoder for the purpose of assisting motion estimation. When Wyner-Ziv coding is applied to transform domain such as DCT, the spatial redundancy is removed by the encoder at the expense of complexity. Some extra information extracted from the original frame, such as high frequency DCT coefficients, is transmitted to the decoder so that better prediction can be made and the quality of the side information be enhanced.

Besides the turbo-code based Distributed Video Coding (DVC) schemes, a DVC system based on syndrome coding has also been proposed. Within the coset specified by the received syndrome bits, the codeword is selected depending on the side information derived from the adjacent decoded frames.

In the existing Wyner-Ziv coding schemes, only single side information is considered in the decoding process. Most efforts have been made to choose or generate more correlated side information. Furthermore, most of the existing schemes have been focused on removing the spatial redundancy by transforming at the encoder. Some existing approaches consider a frame as a two-dimensional stationary Markov random field and utilize the spatial correlation at the decoder. When it comes to dealing with the continuous-tone source, however, these approaches lead to too many states with the computation on a trellis to be used in practice.

SUMMARY

A Wyner-Ziv coding scheme to handle situations where multiple side information signals are available at the decoder is described. The coding scheme may be turbo-code based. Along with a receiving coded frames of a source video content, including coded key frames and turbo-coded Wyner-Ziv frames, the decoder receives multiple side information. The decoder then decodes the turbo-coded Wyner-Ziv frames in view of the multiple side information. Each of the side information contributes to the decoding at least partially separately. Side information can be considered as a noisy copy of the source. With multiple side information, several noisy copies the source are transmitted through different virtual channels. The noises in different copies have different statistical distributions to make unique contributions to the decoding process.

In this scheme, the low-complexity encoder stays the same as the existing schemes. The decoder is improved by directly utilizing multiple available side information in the turbo decoding process. The decoding trellis is extended to have a multi-dimensional signal set on one path. Based on this scheme, a new probability model is introduced to calculate the transitional probability from the conditional probabilities in view of all available side information. Better coding performance can be achieved by using the positive effects offered by each copy of side information. Furthermore, when multiple streams of parity bits are received at the decoder, all parity bits may be used to calculate the transitional probability. The errors existing in some of the streams can thus be automatically corrected.

The Wyner-Ziv coding scheme disclosed herein is particularly suitable for distributed video coding systems. Exemplary multiple side information application scenarios include multi-view video coding, multiple description video coding, and distributed video coding with spatial sub-sampling. In these applications, one of the multiple side information may be the traditional temporal side information contributed from an adjacent frame, while additional side information may be from multi-view frames, multiple description frames and sub-sampling frames.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE FIGURES

The detailed description is described with reference to the accompanying figures. In the figures, the left-most digit(s) of a reference number identifies the figure in which the reference number first appears. The use of the same reference numbers in different figures indicates similar or identical items.

DETAILED DESCRIPTION

Overview

Figure 1:
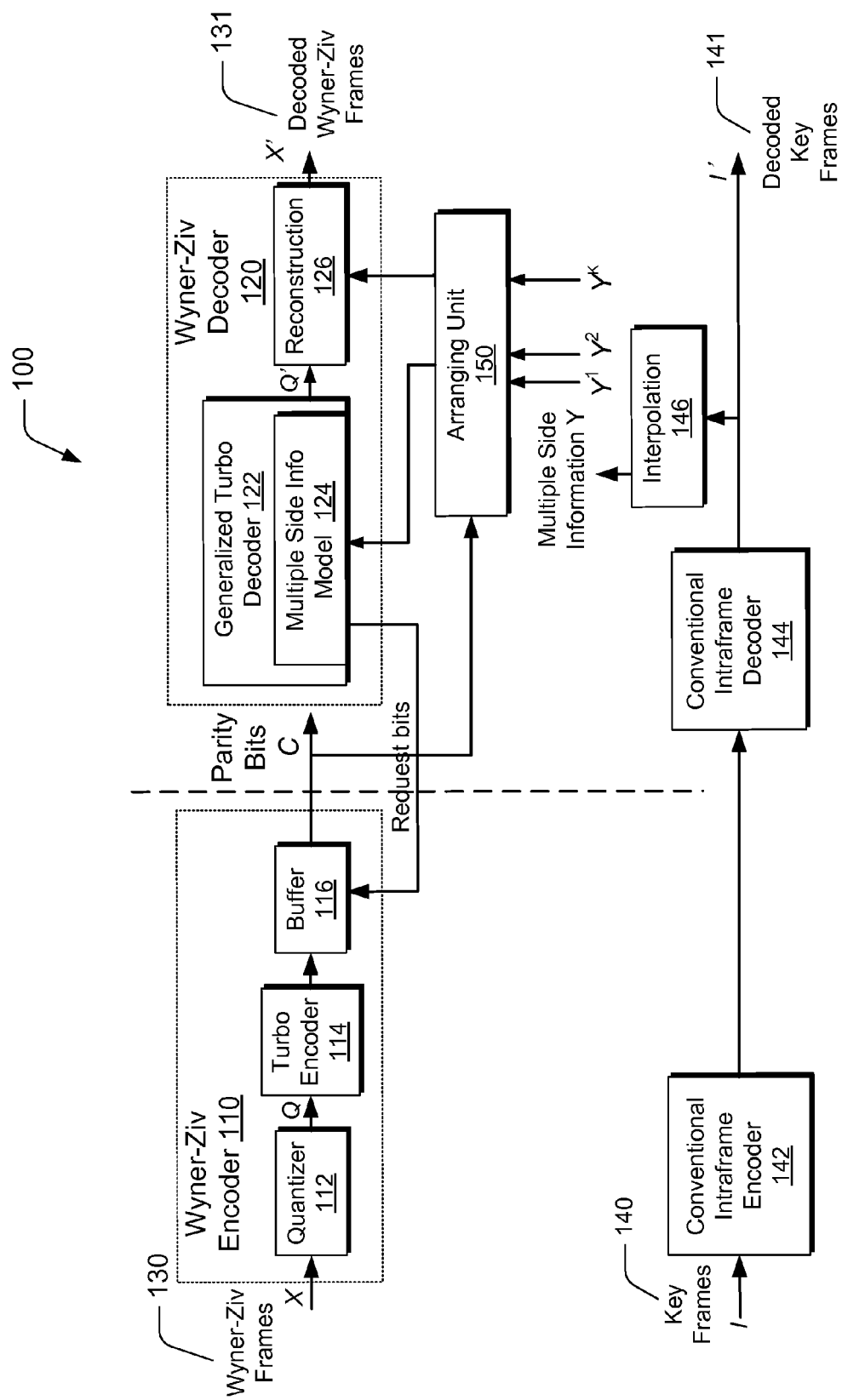
FIG. 1 shows an exemplary video coding system using Wyner-Ziv coding scheme with multiple side information in accordance with the present invention.

This description discloses a method for video coding. Specifically, a turbo-code based Wyner-Ziv coding scheme is designed to handle situations where multiple side information signals are available at the decoder. Side information is usually considered as a noisy copy of the source. As for multiple site information, several noisy copies of the video source may be transmitted through different virtual channels. The noises in different copies have different statistical distributions, making it possible for the multiple side information to compensate each other in error detection and correction.

The video coding method disclosed herein is particularly suitable for use in a Distributed Video Coding (DVC) framework to provide features that do not exist in traditional video coding. The use of multiple side information enables more DVC-related applications such as multi-video video capturing.

There are many application scenarios in which multiple side information signals are available at the decoder. For example, in the multi-view video coding scenario, several side information frames can be derived from neighboring views. The other scenarios of Wyner-Ziv coding with multiple side information include distributed multiple description coding, and distributed video coding with spatially sub-sampling, etc.

A straightforward and simplistic way to handle multiple side information is to combine multiple side information signals together as a single side information signal. However, without the knowledge of the original video source, it is hard to guarantee that the combined side information is always the best. Although the combined single side information may perform better than the side information of the lowest quality, but it is possible that the combined single side information may be worse than the side information of the highest quality, due to an averaging effect.

The coding scheme described herein is an attempt to provide a more efficient way to fully utilize multiple side information at the decoder. In this scheme, the decoder decodes the turbo-coded Wyner-Ziv frames in view of the multiple side information, wherein each side information contributes to the decoding at least partially separately. Because each side information has different statistical distribution, a decoding model that takes into consideration of each individual site information without simply averaging them has the potential to result in a more robust video codec than both a scheme using any of the individual site information alone and a scheme using a combined single side information.

The low-complexity encoder stays the same as the existing Wyner-Ziv coding frameworks. The decoder is improved by directly utilizing multiple available side information in the turbo decoding process. The decoding trellis is extended to have a multi-dimensional signal set on one path. Based on this scheme, a new model is introduced to calculate the transitional probability from the conditional probabilities on all the available side information. Better coding performance can be achieved by using the positive effects offered by each copy of side information.

Furthermore, when multiple streams of parity bits are received at the decoder, all parity bits may be used to calculate the transitional probability. The errors existing in these streams have a greater chance to be automatically corrected than in a system using only one side information and one stream of parity bits.

Although the coding scheme is demonstrated using exemplary processes described herein, it is appreciated that the orders in which processes described herein are not intended to be construed as a limitation, and any number of the described process blocks may be combined in any order to implement the method, or an alternate process.

Wyner-Ziv Coding with Multiple Side Information

This section describes an exemplary scheme of video source coding, in which multiple signals correlated to the source are available at the decoder as multiple side information signals. The coding scheme does not combine the multiple side information signals into one, taking into the consideration that without the knowledge of the source, the decoder does not know which signal or which combination thereof is better. The scheme uses a Wyner-Ziv coding scheme which can jointly utilize multiple side information at the decoder. The new probability model introduced based on an extended turbo decoding trellis calculates transitional probability from the probabilities conditioned on multiple side information. The proposed scheme handles multiple side information in multi-dimensional manner to achieve better coding performance than either selecting one side information or generating one by averaging.

FIG. 1 shows an exemplary video coding system using Wyner-Ziv coding scheme with multiple side information in accordance with the present invention. Video coding system 100 has two major components Wyner-Ziv encoder 110 and Wyner-Ziv decoder 120. Wyner-Ziv encoder 110 includes quantizer 112, turbo encoder 114 and buffer 116. Wyner-Ziv decoder 120 includes turbo decoder 122 and reconstruction unit 126. Turbo decoder 122 of the video coding system 100 has a multiple side information model 124, which will be explained in further detail throughout this disclosure.

Video coding system 100 selects some frames of the video content as Wyner-Ziv frames X (130), and the rest as key frames I (140). For example, even-numbered frames may be selected as key frames X, while odd-numbered frames may be selected as Wyner-Ziv frames I. In general, there is a limitation for the maximum number of Wyner-Ziv frames for each key frame, because too few key frames and too many Wyner-Ziv frames may cause loss of coherency for maintaining a reasonable decoding quality.

Key frames I may be encoded using a conventional intra-frame encoder 142, and then passed to a conventional intra-frame decoder 144 to generate decoded key frames I' (141). As will be shown later, one of the side information may be generated from the decoded key frames I' by interpolation 146 or other techniques such as advanced motion estimation and compensation procedure. For example, a prediction of the current video frame may be made, based on the temporal information in the past, to generate temporal side information.

The source signal of Wyner-Ziv frame 130 is represented by $X=(x_1, x_2, x_3, \ldots, x_n)$ which is scalar quantized first by quantizer 112, where n is the number of samples in the source signal sequence. Quantizer 112 may be a $2^q$ level quantizer where the level q is an independently varied parameter according to the expected quality of output and the available channel bandwidth. After that, the quantization indices Q are fed into turbo encoder 114 to generate encoded turbo codes. Turbo encoder 114 is typically a Slepian-Wolf based encoder. The encoded turbo codes include systematic codes (not shown) and parity bits stream C. At least some of the systematic codes may be discarded before sent to the turbo decoder 122.

The parity bits stream C may be punctured for the purpose of rate adaptation, according to the correlation between the source signal and the side information $Y (Y^1, Y^2, \ldots Y^k)$. Because estimating correlation at the encoder can be a quite difficult task, in one embodiment the rate adaptation is realized through the feedback channel from the decoder. If the decoder cannot decode the symbols correctly, a bit-request is sent back to the encoder. Upon receiving the bit-request, additional punctured parity bits are transmitted. The process is repeated until the frame is successfully decoded. Other types of embodiments, such as one that estimates the number of parity bits at the encoder side independently of the bit-request feedback loop may also be used.

The parity bits C are sent to turbo decoder 122 for decoding. Multiple side information $Y (Y^1, Y^2, \ldots Y^k)$ is provided to turbo decoder 122 through side information arranging unit 150. Multiple side information Y is processed by multiple side information model 124 for participating the decoding. Turbo decoder 122 decodes the encoded bits of Wyner-Ziv frames 130 using the multiple side information model 124, which in one embodiment provides a probability model. As will be shown below in further detail, the probability model computes a decoding path interval probability in view of the multiple side information $Y (Y^1, Y^2, \ldots Y^k)$. Each side information $Y^m$ of the multiple side information $Y (Y^1, Y^2, \ldots Y^k)$ contributes to the decoding path interval probability at least partially separately.

The reconstruction unit 126 receives the decoded Wyner-Ziv bits Q' and reconstructs a decoded Wyner-Ziv frame X', which may be further used to reconstruct the source video content using the decoded key frames for user presentation.

The parity bits C are decoded in conjunction with side information Y. The decoding process in one embodiment is based on the judgement of posterior probability (PP), as will be illustrated in a later section "Probability Model" of the present description.

Figure 2:
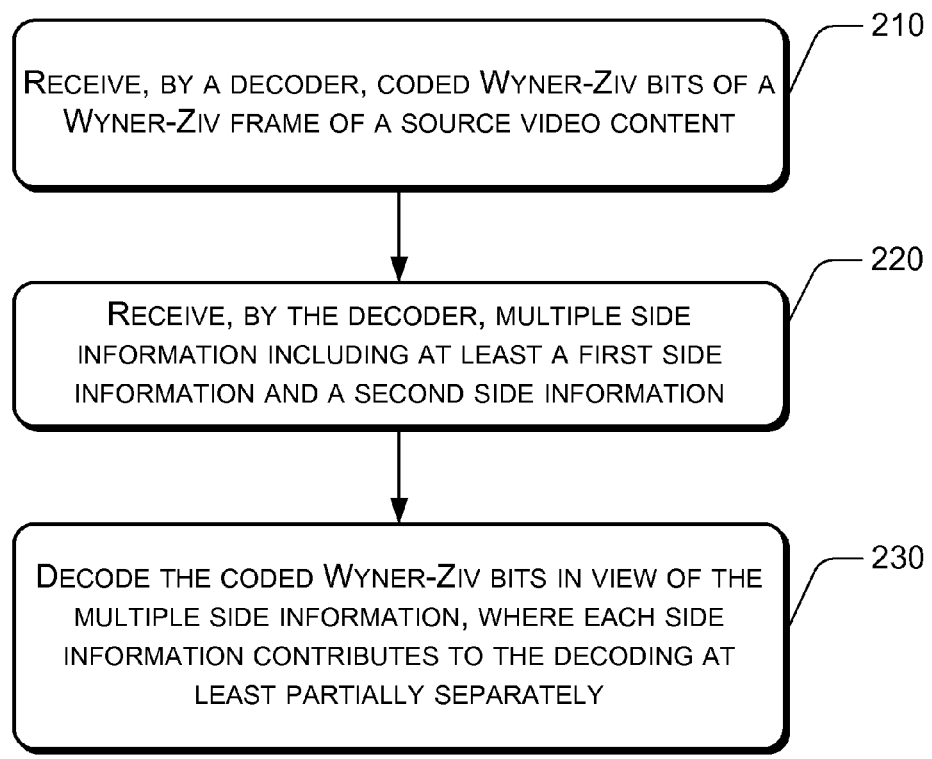
FIG. 2 shows an exemplary video decoding process using the Wyner-Ziv video coding system of FIG. 1.

FIG. 2 shows an exemplary video decoding process using the Wyner-Ziv video coding system of FIG. 1. In this description, the order in which a process is described is not intended to be construed as a limitation, and any number of the described process blocks may be combined in any order to implement the method, or an alternate method.

At block 210, the decoding system (e.g., the Wyner-Ziv decoder 120 of FIG. 1) receives turbo-coded Wyner-Ziv bits of a Wyner-Ziv frame of a source video content.

At block 220, the decoding system receives multiple side information including at least a first side information and a second side information. Typically, the decoder (122) which receives the coded Wyner-Ziv frames for coding also receives the multiple side information.

At block 230, the decoder (122) decodes the turbo-coded Wyner-Ziv bits in view of the first side information and the second side information. The decoding uses the above-described coding scheme in which the first side information and the second side information each contribute to the decoding at least partially separately.

In practice, coded key frames (140) are received by a conventional decoder (144), while the turbo-coded Wyner-Ziv frames (130) are received by the Wyner-Ziv turbo decoder (122). The bits of a turbo-coded Wyner-Ziv frame may be encoded in any suitable domain including pixel domain, discrete cosine transform (DCT) domain, and wavelet domain. The coded key frames are decoded typically using a conventional decoder (144).

In one embodiment, the different side information sets in the multiple side information are generated from different information domains, such that they would have different statistical distribution to make a separate contribution to the decoding process. For example, the first information domain may be temporal in which the first side information is generated temporally by interpolating a decoded reference frame adjacent to the Wyner-Ziv frame being decoded. The decoded reference frame may be either one of the decoded key frames or one of the decoded Wyner-Ziv frames. The second information domain may be spatial in which the second side information is generated from a decoded neighboring spatial portion in the Wyner-Ziv frame being decoded.

In one embodiment, the above video coding process is implemented in a multi-view video coding system, in which each Wyner-Ziv frame has multiple sub-view frames. One or more side information may be generated from the multiple sub-view frames of the Wyner-Ziv frame being decoded. Several sets of side information may be generated from different ones of the multiple sub-view frames of the Wyner-Ziv frame being decoded. In one example, the first side information is generated temporally by interpolating a decoded reference frame adjacent to the Wyner-Ziv frame being decoded, while the second side information is generated from one of the multiple sub-view frames of the Wyner-Ziv frame being decoded. Further detail of an exemplary multiple-view video coding system is provided in a later section of the present description.

In another embodiment, the video coding system is implemented in a multiple description coding system, wherein the source video content is divided into multiple sub-stream descriptions each sent to a separate channel for decoding. At least one of multiple side information is generated from one of the multiple sub-stream descriptions decoded. Several sets of side information may be generated from different ones of the multiple sub-stream descriptions of the Wyner-Ziv frame being decoded. One side information may be generated temporally by interpolating a decoded reference frame adjacent to the Wyner-Ziv frame being decoded, and another side information may be generated from one of the multiple substream descriptions decoded.

In another embodiment, the video coding system is implemented in a distributed video coding system with spatial sub-sampling, wherein the source video content comprises a spatially sub-sampled layer sent to a separate channel for decoding. At least one of the multiple side information may be generated from the spatially sub-sampled layer decoded. In one embodiment, one side information is generated temporally by interpolating a decoded reference frame adjacent to the Wyner-Ziv frame being decoded, and another side information is generated from the spatially sub-sampled layer decoded.

As will be shown further below, to decode the turbo-coded Wyner-Ziv frames, the decoding system computes a conditional probability associated with a decoding path interval. Multiple side information each contributes to the conditional probability at least partially separately. Computing the decoding path interval probability is done by computing a transitional probability associated with a transition from state s' and state s using Eq. (4) if a single parity bit stream is received by the decoder, or using Eq. (5) if multiple parity bit streams are received by the decoder.

Figure 3:
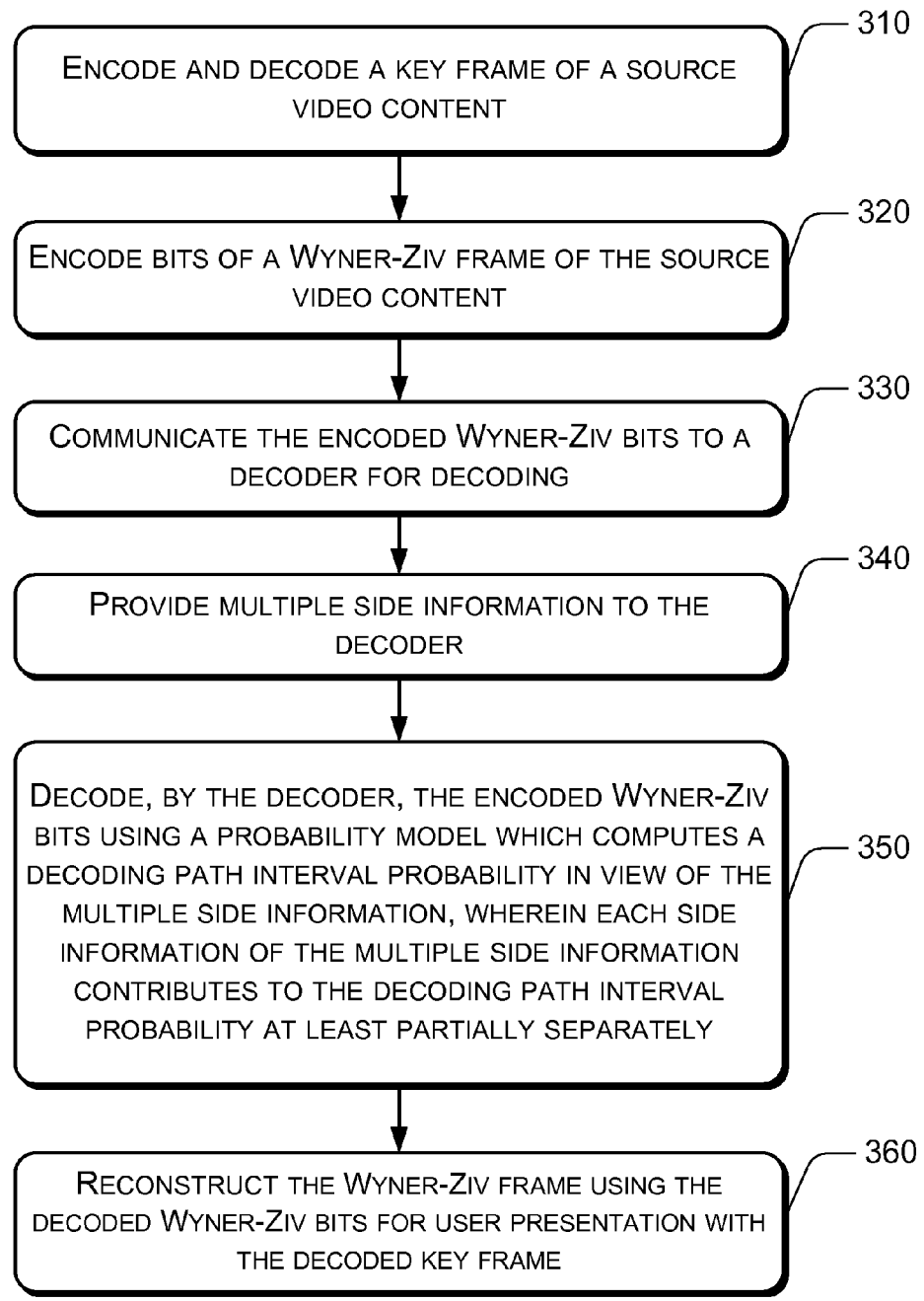
FIG. 3 shows an exemplary video coding/decoding process using the Wyner-Ziv video coding system of FIG. 1.

FIG. 3 shows an exemplary video coding/decoding process using the Wyner-Ziv video coding system of FIG. 1.

At block 310, the video coding system 100 encodes and decodes key frames 140 of a source video content. As previously discussed, key frames 140 are encoded and decoded using a separate conventional encoder (142) and decoder (144), and are sent to the decoder 122 separately, e.g. through a virtual channel.

At block 320, turbo encoder 110 encodes bits of a Wyner-Ziv frame 130 of the source video content.

At block 330, encoded Wyner-Ziv bits are sent to turbo decoder 122 for decoding.

At block 340, multiple side information is provided to the turbo decoder 122.

At block 350, the turbo decoder 122 decodes the encoded Wyner-Ziv bits using a probability model which computes a decoding path interval probability in view of the multiple side information. According to the probability model, which is described in further detail below, each side information of the multiple side information contributes to the decoding path interval probability at least partially separately.

At block 360, reconstruction unit 126 reconstructs the Wyner-Ziv frame using the decoded Wyner-Ziv bits Q'. The reconstructed Wyner-Ziv frames X' (131) and the decoded key frames I' (141) are then put together for user presentation by the video coding system 100.

The above video coding process is particularly suited for implementation in a distributed video coding system.

Probability Model

The parity bits C are decoded in conjunction with side information Y. The decoding process in one embodiment is based on the judgement of posterior probability (PP). Given the possible value j, PP is expressed as $$PP = \sum_{\chi,j} \alpha_i - 1(s')\gamma_i(s', s)\beta_i(s), \quad (1)$$

where $\chi_j$ is the set of all transitions from state s' to s with the input j. The probability functions $\alpha_i(s)$ and $\beta_i(s)$, which are the probabilities of approaching the state s at the instant i from the starting state and the ending state respectively, can be recursively calculated from the probability $\gamma_i(s', s)$.

For simplicity, consider first the case where only single side information Y and single parity bit stream C are available to the decoder. $\gamma_i(s', s)$ is represented as $$\gamma_i(s',s)=P(j)P(j,u_i|y_i,c_i), \quad (2)$$

where $u_i$ is the output parity bit of the transition from state s' to s with the input j; $y_i$ is referred to as the i-th sample of the side information Y; and $c_i$ is the received parity bit at the instant i. The transitional probability can be further calculated as $$P(j,u_i|y_i,c_i)=P(j|y_i)P(u_i|c_i). \quad (3)$$

The conditional probability on side information can be calculated numerically as the probability of difference between source and side information. The distribution of the difference is generally assumed to be a Laplacian function. The decoded quantization indices sequence I and the side information Y are used to produce the reconstruction X' as E(X'|I, y).

The above Eqs. (2) and (3) are extended to the case where multiple side information and multiple parity bit streams are obtainable at the Wyner-Ziv decoder 120, as described below.

Multiple side information signals denoted as $(Y^1, Y^2, \ldots$ and $Y^k)$, and k parity bit streams are denoted as $C^1, C^2, \ldots$ and $C^k$, where k is the number of side information signals. In an exemplary multiple side information coding scheme, $Y^1$, $Y^2, \ldots$ and $Y^k$ are arranged to form the side information:

$$\vec{Y}=(<y_1^1 y_1^2 \ldots y_1^k>, <y_2^1 y_2^2 \ldots y_2^k>, \ldots, <y_n^1 y_n^2 \ldots y_n^k>).$$

Corresponding to the source signal $X=(x_1, x_2, x_3, \ldots, x_n)$, the multiple side information $\vec{Y}$ has n elements (samples) in a sequence. Each element of the multiple side information $\vec{Y}$ contains k received symbols at the same instant.

The multiple parity bit streams are arranged in a similar manner to get:

$$\vec{C}=(<c_1^1 c_1^2 \ldots c_1^k>, <c_2^1 c_2^2 \ldots c_2^k> \ldots <c_n^1 c_n^2 \ldots c_n^k>).$$

If the parity bits for symbol m ($1 \leq m \leq n$) are not sent, the k parity bits from $c_m^1$ to $c_m^k$ maybe set to a special value other than 1 or 0.

In turbo decoding, the conditional probability on the side information is usually regarded as the metric of agreement between the estimated value of the current symbol and the received side information. With multiple side information available, the metrics of the agreement between the estimate and each side information may be combined using a weighting factor. The weighting factor is determined by the correlation between the source and the side information. When the knowledge of correlation cannot be obtained, all side information preferably has the identical weight.

Under certain conditions (e.g., multiple side information with one parity bit stream for each instant i), Eq. (3) is extended to express the conditional probability as $$P(j, u_i | Y(i), C(i)) = P(u_i | c_i) \sum_{t=1}^{k} P(j | y_i^t). \quad (4)$$

The exemplary turbo decoder using multiple side information thus operates onto a k-dimensional signal set, where k is the number of side information signals. From the above Eq. (4), it is seen that each side information signal $y_i$ contributes to the conditional probability separately. In contrast, a direct averaging method would just combines multiple side information into a single side information signal that is 1-dimensional.

The above Eq. (4) may be modified by adding a weight parameter for the contribution of each side information signal in the summation. However, because usually there is no information available for making a principled determination of such weight parameters, it may be assumed that all side information have an equal weight, as in Eq. (4).

Finally, when the decoder can access both multiple side information and multiple Wyner-Ziv parity bit streams, the above Eq. (4) is further extended to express the conditional probability as $$P(j, u_i \mid Y(i), C(i)) = \sum_{t=1}^{k} P(j \mid y_i^t) P(u_i \mid c_i^t). \quad (5)$$

The above assumes that each side information signal $y_i$ corresponds to a parity bitstream $c_i$. When this condition is not strictly met (e.g., there are fewer parity bit streams $c_i$ than the number of side information signals $y_i$), the above Eq. (5) may be modified to still at least partially take into account the available information.

The conditional probability model based on the above Eq. (5) allows the multiple Wyner-Ziv parity bit streams to each separately contribute (or influence) the conditional probability. The parity bits are generated from the original signal and used to correct the errors existing in the side information. Errors may be introduced to Wyner-Ziv bit stream during transmission. Because the noises existing in multiple side information vary in statistics, the contributions from individual side information may compensate each other. In the traditional probability model with single side information and a single parity bit stream, since only one parity bit stream is available, turbo decoding might fail with such errors occur. In the above-described probability model with multiple side information and multiple parity bit streams, all received streams of parity bits contribute to the transitional probability. As a result, the influence of false parity bits are relieved or even eliminated.

Figure 4:
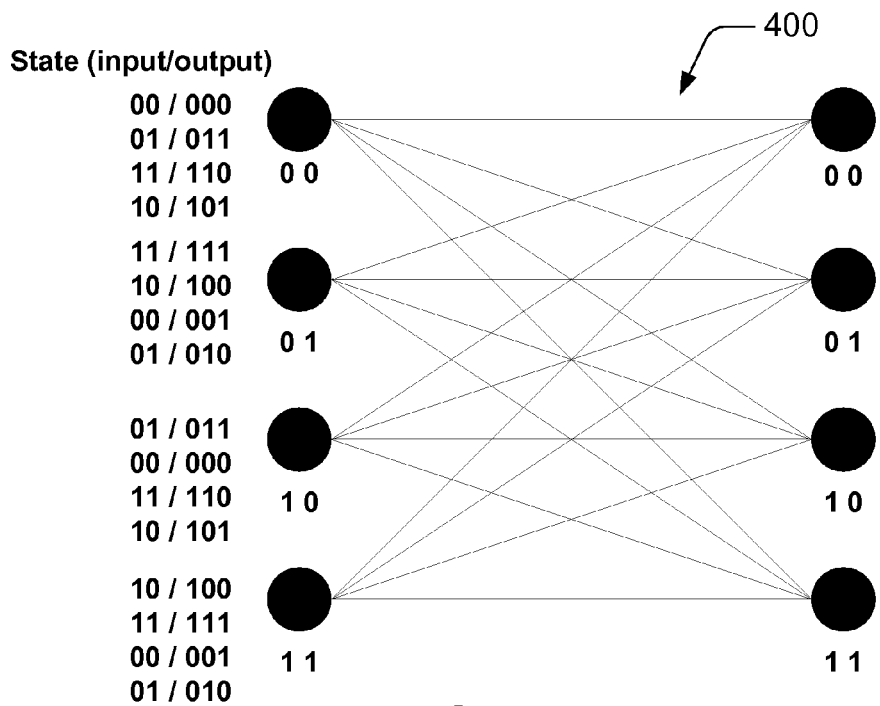
FIGS. 4 and 5 illustrate trellis diagrams of the Wyner-Ziv coding scheme.
Figure 5:
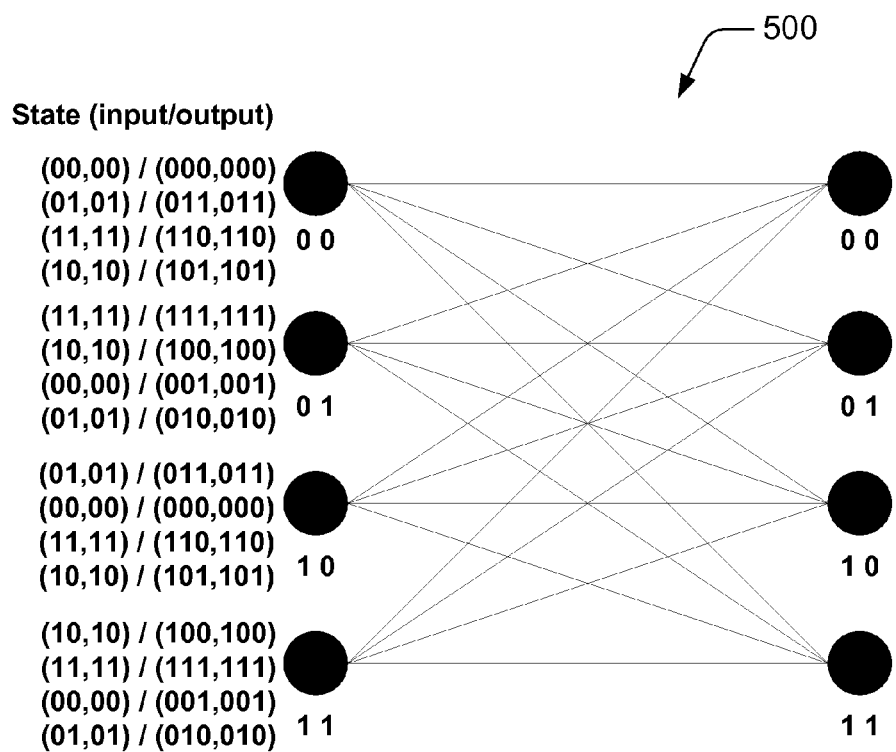

The combined conditional probability metric is then used to choose the decoding path, which is illustrated using a multiple trellis with reference to FIGS. 4 and 5.

FIGS. 4 and 5 illustrate trellis diagrams of the Wyner-Ziv coding scheme. An exemplary coding of ⅔ rate (i.e., every two input bits generate a three output its), 4-state (corresponding to two memory registers) constituent codes is used as an example to illustrate. FIG. 4 shows a configuration of single side information, while FIG. 5 shows a configuration having multiple side information in accordance with the present disclosure.

Generally speaking, a turbo decoder is committed to search for a path, along which each symbol has a maximum PP, through a trellis. At the encoder (e.g., turbo encoder 114 of FIG. 1), a generated symbol consists of the systematic bits and the parity bit. At the decoder side (e.g., turbo decoder 122), the corresponding sample from the side information assumes an approximation of the systematic part. The received parity bit is used to judge the validity of each possible path. The trellis coding 400 in FIG. 4 where single side information is used is similar to a conventional trellis of a ⅔ rate, 4-state constituent codes.

Consider now the case where a decoder can access multiple side information and a single Wyner-Ziv bit stream. The decoding trellis of this exemplary configuration can be extended by assigning a multi-dimensional signal set to each branch. The input and output signal sets of each branch have repeated symbols, and the repetition times are equal to the number of received side information at the decoder.

FIG. 5 illustrates the extended trellis when two sets (versions) of side information (i.e., double side information) are available. The basic transitions of the multiple trellis coding 500 are identical with those of the single trellis coding 400. In contrast, however, the input/output states of the multiple trellis coding 500 have extended from a single dimension to two dimensions. For example, the input/output state 00/000 in trellis coding 400 of FIG. 4 turns into a two-dimensional state (00, 00)/(000, 000) in multiple trellis coding 500 of FIG. 5, in which the input and output signal sets repeated twice. The two-dimensional signal set may be seen as having two separate elements contributing the coding metric described above.

Distributed Video Coding with Temporal and Spatial Correlation Exploited Only at the Decoder The Wyner-Ziv coding with multiple side information disclosed herein is particularly suited for applications in Distributed Video Coding systems. The following describes, with reference to FIG. 6 and FIG. 7, an exemplary pixel-domain Distributed Video Coding scheme, in which both the temporal and the spatial correlations are exploited only at the decoder.

Distributed Video Coding technologies are committed to compress videos with the limited resources. Based on the Wyner-Ziv theorem, the task of exploiting correlation can be shifted to the decoder, and the low complexity encoding is then achieved. This feature is quite desirable in mobile devices and distributed sensor networks.

In the exemplary pixel-domain Distributed Video Coding scheme, in which both the temporal and the spatial correlations are exploited only at the decoder (120), a video is treated as a collection of data correlated in temporal and spatial directions. Besides splitting a video into frames at different time instants, a frame is further split by spatially sub-sampling. Each part yielded from splitting is then encoded individually. At the decoder, the side information signals are from both adjacent frames and the spatially decoupled signals.

To utilize these multiple side information signals, the new probability model disclosed herein is used, in which the transitional probability is calculated from the conditional probabilities on the multiple side information signals. The coding efficiency is enhanced by further removing the spatial redundancy, while the encoding complexity remains the same as the conventional pixel-domain DVC techniques that only consider the temporal correlation.

The correlation in a video inherently exists in both temporal direction and spatial directions. Splitting a video into frames both at different time instants and spatially sub-sampling provides to the decoder multiple side information signals derived from the adjacent frame and the neighboring pixels in one frame. How to use the multiple side information at the decoder is critical when the decoder does not know which side information is better without the knowledge of the original signal to be decoded.

In the exemplary distributed video coding scheme, each symbol to be decoded has multiple side information including one from temporal direction and some decoded neighboring pixels. Since side information is usually considered as a noisy copy of source, the multiple side information signals are taken as multiple copies of source transmitted through the different virtual channels. The decoder (120) combines all the conditional probabilities derived from the multiple side information signals in the decoding process. The exploitation of spatial correlation enhances the coding efficiency, whereas the encoding complexity remains the same as the original turbo code based Wyner-Ziv coding performed in pixel domain. Further detail of the exemplary pixel-domain Distributed Video Coding scheme is provided below.

Figure 6:
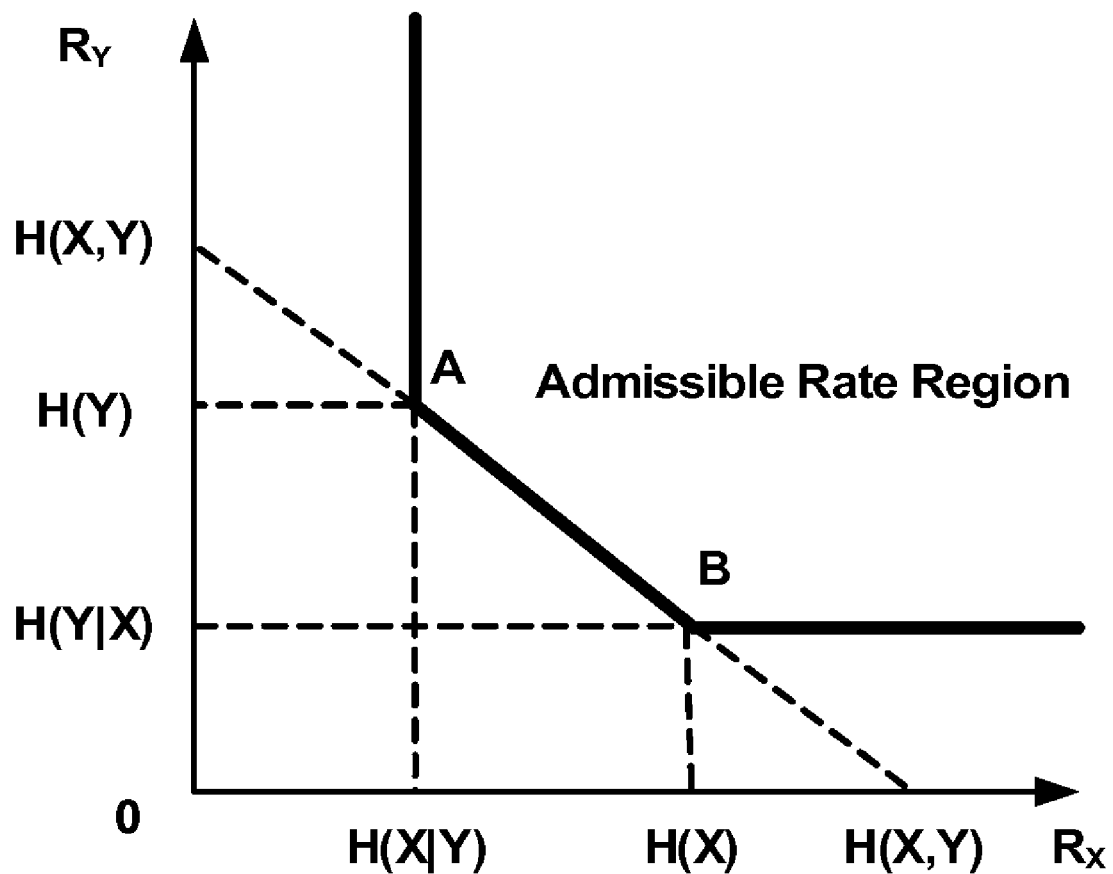
FIG. 6 is a diagram showing an admissible rate region for separate encoding and joint decoding two correlated sequences X and Y.

The Exploitation of the Spatial Correlation:

FIG. 6 shows an admissible rate region for separate encoding and joint decoding two correlated sequences X and Y.

RX and RY denote the minimum number of bits per symbol needed to encode the sequences X and Y, respectively, so that the encoded sequences X and Y can be reproduced perfectly at the decoder side. When X and Y are separately encoded but jointly decoded, the admissible rate region of RX and RY established in is depicted in FIG. 6.

The compression techniques intend to encode X and Y with the sum of RX and RY approaching the line AB, namely the joint entropy H(X, Y). The vertex points A and B correspond to the asymmetric case in Distributed Video Coding, which means X (Y) is encoded in the presence of the correlated Y(X) at the decoder. As for point A, in an ideal situation, $$R_x = H(X \mid Y)$$
$$R_y = H(Y)$$
$$R_x + R_y = H(X \mid Y) + H(Y) = H(X, Y)$$
(6)

Other points on the line AB except A and B correspond to the symmetric case, where both encoders of X and Y send partial information to the decoder. This can be achieved by binary linear code. The most-likely codeword pair is searched for from the pair of cosets which are determined by the received syndromes from two encoders. Due to the consideration of complexity, most of the existing Distributed Video Coding techniques utilize temporal correlation in asymmetric manner. The decoder takes the previously decoded frames as the side information.

Figure 7:
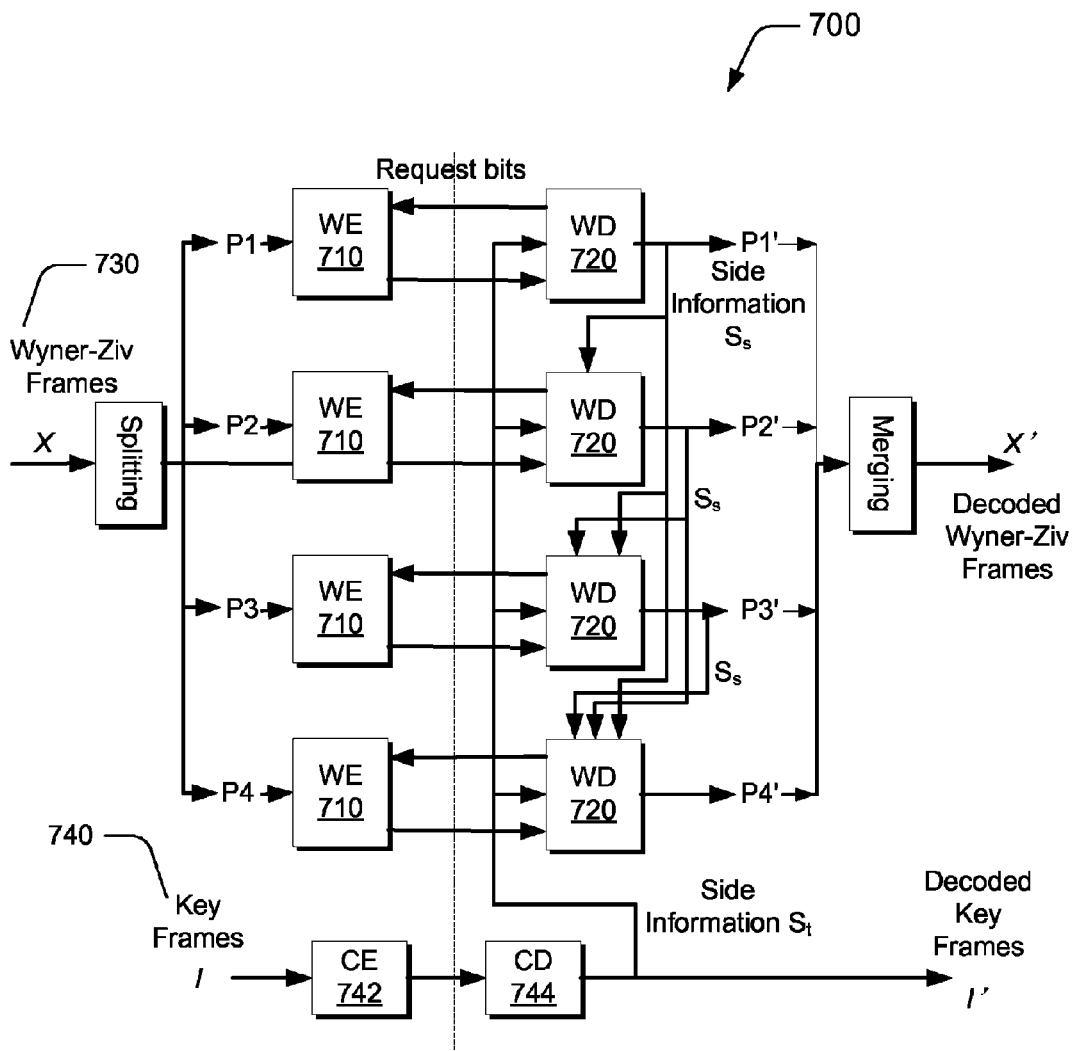
FIG. 7 shows an exemplary Wyner-Ziv video coding scheme with both temporal and spatial correlation exploited only at the decoder.

FIG. 7 shows an exemplary Wyner-Ziv video coding scheme with both temporal and spatial correlation exploited only at the decoder. Video coding system 700 of FIG. 7 should be understood with reference to both FIG. 7 and FIG. 1. For example, the Wyner-Ziv encoder (WE) 710 and Wyner-Ziv decoder (WD) 720 may be adapted from Wyner-Ziv encoder 110 and Wyner-Ziv decoder 120, respectively, of Wyner-Ziv coding system 100 of FIG. 1.

Similar to that in a FIG. 1, the key frames 740 (e.g., intra frames or the odd frames) are encoded and decoded with a conventional video coding system including conventional encoder 742 and conventional decoder 744. The Wyner-Ziv frames 730 (e.g., inter frames or the even frames) are Wyner-Ziv coded.

In the example shown in FIG. 7, each Wyner-Ziv frame 730 is split into four parts. It is appreciated that in practice each Wyner-Ziv frame 730 may be split into any number of parts, depending on the need and configuration. Four neighboring pixels are arranged in four sets P1, P2, P3 and P4 respectively, and are encoded and transmitted successively. The Wyner-Ziv encoder 110 of FIG. 1 may be adopted for use as Wyner-Ziv encoder 710. It is appreciated that the separate blocks representing Wyner-Ziv encoder 710 in FIG. 7 do not necessarily suggest that four separate encoders are used, but rather that the same encoder may be used successively.

Similar to that in FIG. 1, the pixel values are scalar quantized first, and the quantized symbols are then fed into a turbo encoder of Wyner-Ziv encoder 710. The generated parity bits are punctured and delivered according to the correlation. The bits-request feedback loop or other configuration for parity bit estimation as illustrated in FIG. 1 may be used in video coding system 700.

As the transmitted four sets P1, P2, P3 and P4 are decoded successively, the previous set(s) is used as side information $S_s$ in decoding the subsequent sets. For example, as the first set P1 is decoded by Wyner-Ziv decoder 720, the decoded signal of P1 may be successively applied to the decoding of the next three sets P2, P3 and P4 as side information. As the second set P2 is decoded by Wyner-Ziv decoder 720, the decoded signal of P2 may be successively applied to the decoding of the next two sets P3 and P4 as side information. Likewise, as the third set P2 is decoded by Wyner-Ziv decoder 720, the decoded signal of P3 may be successively applied to the decoding of the next set P4 as side information. The application of such side information exploits spatial correlation at the decoder side (Wyner-Ziv decoder 720). It is appreciated that although a previously decoded set is available to be applied as side information in the decoding of all subsequent set(s), such application is not required, and may be selectively exercised.

In addition, temporal side information $S_t$ is generated from the conventionally encoded and decoded key frames I and I', and added to Wyner-Ziv decoder 722 to assist the decoding of the Wyner-Ziv frames 730. The temporal side information $S_t$ and the above-discussed spatial side information $S_s$ together constitute multiple side information which enable video coding system 700 to exploit both temporal and spatial correlation at the decoder side (Wyner-Ziv decoder 720). The probability model to exploit the multiple side information is discussed below in further detail. The probability model discussed below is a specific application of the general probability model described previously.

Probability Calculation with Multiple Side Information:

In the multiple side information scheme of FIG. 7, the Wyner-Ziv decoder 720 is extended to handle multiple side information. Two categories of side information are available: $S_t$ yielded temporally by the interpolation of the adjacent frames and $S_s$ containing the decoded neighboring pixels. The first part P1 is decoded without any spatial redundancy removed. All other three parts may make use of any previously decoded neighboring pixels as side information.

The multiple side information model is used to calculate probabilities conditioned on multiple side information. The calculation of probability may be extended beyond a mere selection in terms of maximum likelihood. In one embodiment, the conditional probability is expressed as $$P(b = n \mid SideInfo) = P(b = n \mid s_t) + \sum_{j=1}^{4} P(b = n \mid s_{sj}),$$
(7)

where b denotes the current symbol to be decoded and n is the estimated value of the current symbol b. The statistical distribution of difference between source and side information is assumed to have a Laplacian model. Therefore, the conditional probability can be further calculated as $$P(b = n \mid SideInfo) = P(\tilde{n} - s_t) + \sum_{j=1}^{4} P(\tilde{n} - s_{sj})$$
(8)

where ñ is yielded by de-quantization of n.

Decoding:

The Wyner-Ziv decoder 720 decodes the Wyner-Ziv bits in conjunction with the multiple side information. The decoding process is based on the judgment of posterior probability (PP). Given a possible value j, PP is expressed as Eq. (1). The transitional probability is given by Eqs. (2) and (3), or equivalently expressed as $$\gamma_i(s',s)=P(b=j)P(b=j|\text{SideInfo})P(u_i|p_i) \quad (9)$$

where $u_i$ is the output parity bit of the transition from state s' to s with the input j and the corresponding received parity bit $p_i$. The conditional probability given side information is calculated using Eq. (8).

Four parts P1', P2', P3' and P4' (corresponding to P1, P2, P3 and P4, respectively) are reconstructed from quantized symbols and corresponding side information available and merged to yield decoded Wyner-Ziv frame X.

Implementation Environment

The above-described techniques may be implemented with the help of a computing device, such as a server, a personal computer (PC) or a portable device having a computing unit.

Figure 8:
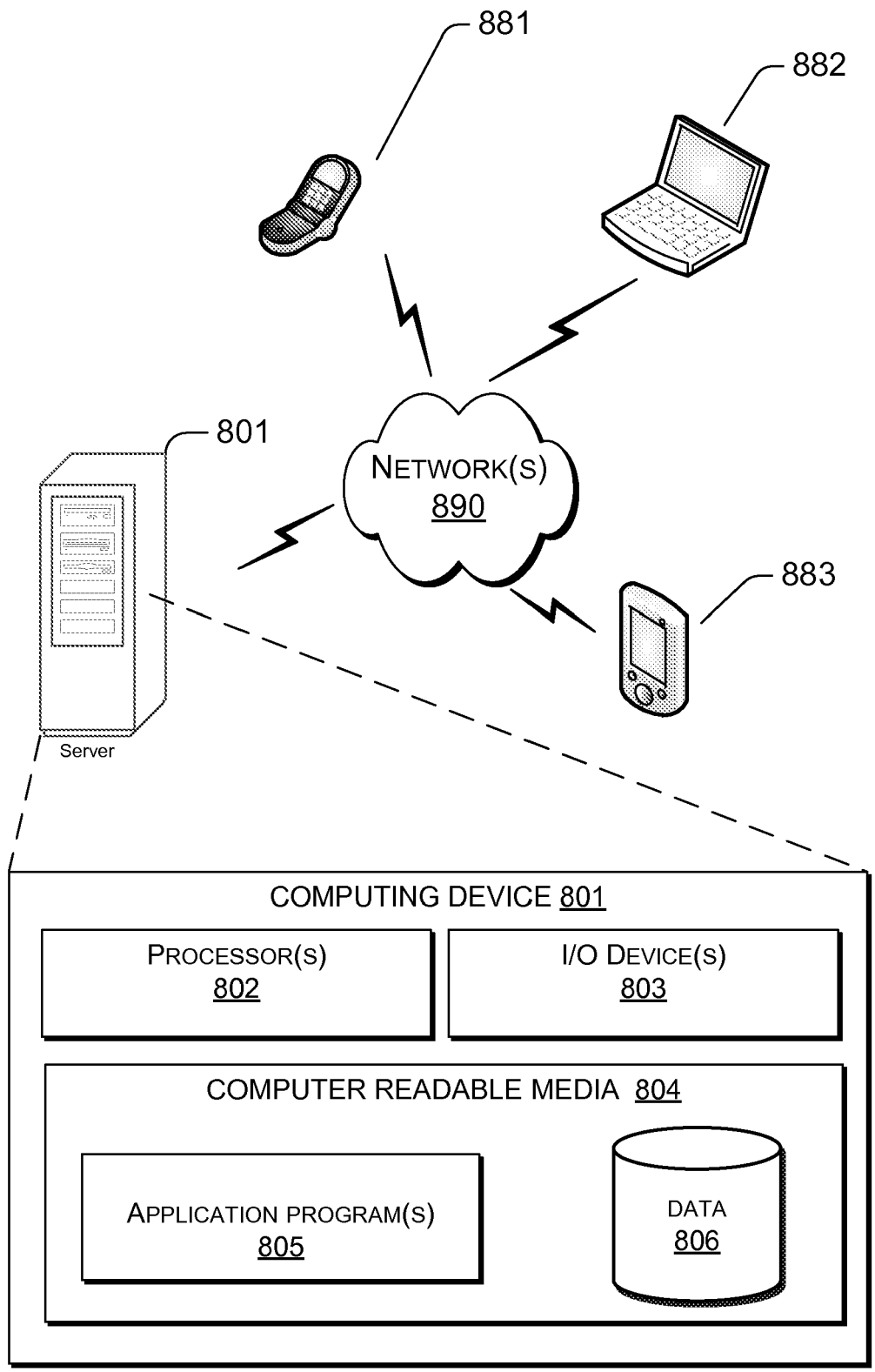
FIG. 8 shows an exemplary environment for implementing the video coding system of the present disclosure.

FIG. 8 shows an exemplary environment for implementing the video coding system (e.g., 100 of FIG. 1) of the present disclosure. Server computing system 801 includes processor(s) 802, I/O devices 803, computer readable media (e.g., memory) 804, and network interface (not shown). The server computing device 801 is connected to client computing devices 881, 882 and 883 through networks 890. Each client computing device 881, 882 and 883 may also have its own processor, I/O devices and computer readable media.

The computer readable media 804 stores application program modules 805 and data 806. Application program modules 805 contain instructions which, when executed by processor(s) 802, cause the processor(s) 802 to perform actions of a process described herein (e.g., the processes of FIG. 2).

For example, in one embodiment, computer readable medium 804 has stored thereupon a plurality of instructions that, when executed by one or more processors 802, causes the processor(s) 802 to perform the following operations:

(i) receiving coded frames of a source video content, where the coded frames include coded key frames and turbo-coded Wyner-Ziv frames;

(ii) receiving multiple side information;

(iii) decoding the coded key frames; and (iv) decoding the turbo-coded Wyner-Ziv frames in view of the multiple side information, which each contributes to the decoding at least partially separately.

It is appreciated that the computer readable media may be any of the suitable memory devices for storing computer data. Such memory devices include, but not limited to, hard disks, flash memory devices, optical data storages, and floppy disks. Furthermore, the computer readable media containing the computer-executable instructions may consist of component(s) in a local system or components distributed over a network of multiple remote systems. The data of the computer-executable instructions may either be delivered in a tangible physical memory device or transmitted electronically.

It is also appreciated that a computing device may be any device that has a processor, an I/O device and a memory (either an internal memory or an external memory), and is not limited to a personal computer. For example, a computer device may be, without limitation, a server, a PC, a portable device, a mobile phone, a game console, a set top box, and a computing unit built in another electronic device such as a television, a display, a printer or a digital camera. Especially, the server computer device 802 may be a cluster of servers.

Figure 9:
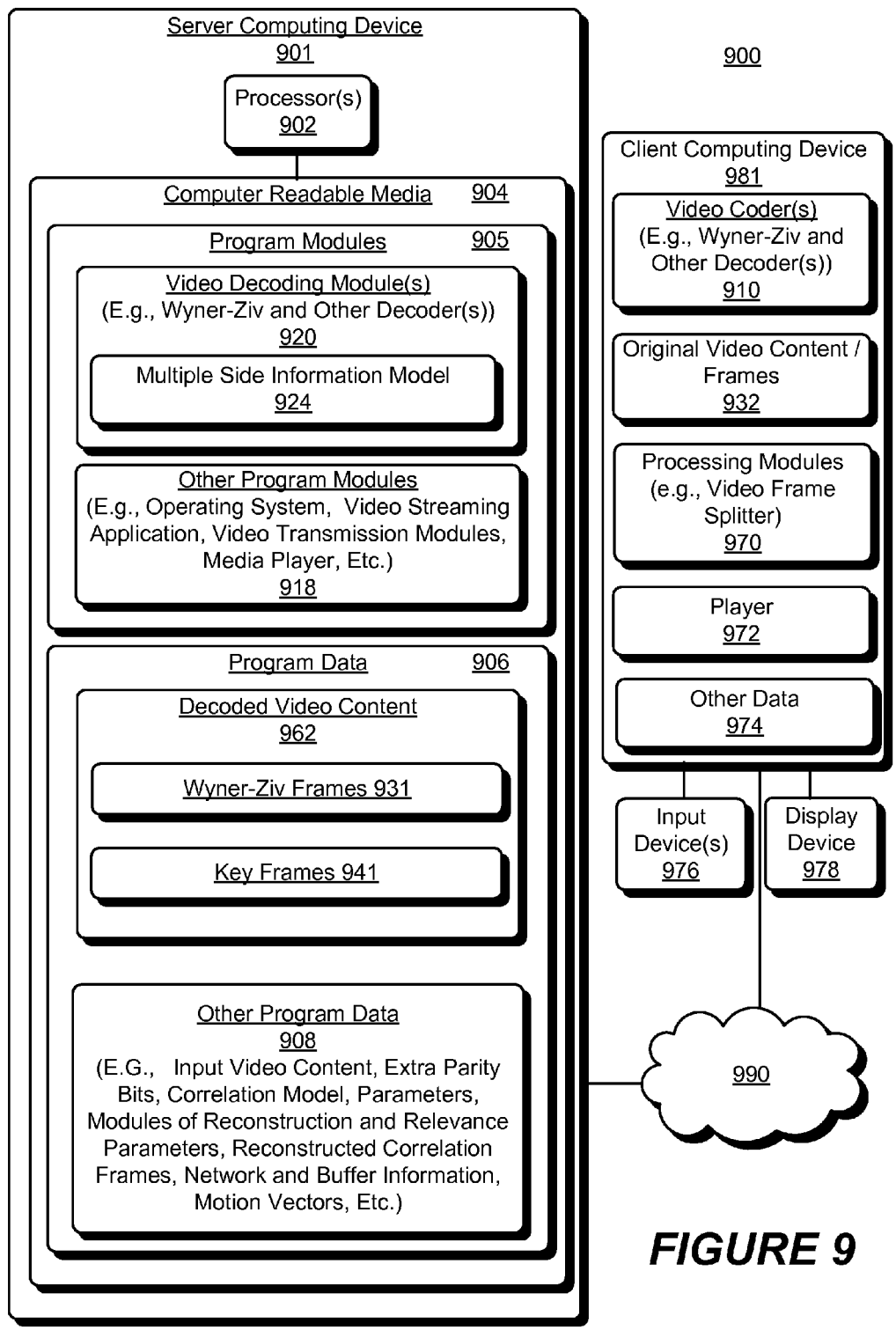
FIG. 9 is a block illustration of the exemplary environment for implementing the video coding system of FIG. 8.

FIG. 9 is a block illustration of the exemplary environment for implementing the video coding system of FIG. 8. For purposes of exemplary description and illustration, the components of FIG. 9 are described with respect to the components of FIG. 1 and FIG. 8. In the description, the leftmost reference numeral of a component identifies the first figure wherein the component was introduced.

Referring to FIG. 9, server computing device 901 hosts the decoder side of the video coding system (e.g., 100), while client computing device(s) 981 hosts the encoder side of the video coding system. Server computing device 901 and client computing device(s) 981 communicate with each other through network 990.

Server computing device 901 has processor(s) 902 and computer readable media 904. Program modules 905, program data 906, and other program data 908 are stored on computer readable media 904. Program modules 905 include video decoding modules (e.g., Wyner-Ziv decoders) 920 and other program modules 918. Multiple side information model 924 may be part of the video decoding modules 920 for Wyner-Ziv decoding using multiple side information in accordance with the present disclosure. Program data 906 includes decoded video content 962 which includes decoded Wyner-Ziv frames 931 and decoded key frames 941.

Client computing device(s) 981 has video coder 910 such as Wyner-Ziv encoder, original video content/frames 932, processing modules 970 such as a video frame splitter, video player 972, and other data 974. Client computing device 981 may also have a processor (not shown). For user input and user presentation of the video content, client computing device 981 may also have input device 976 and display device 978.

Exemplary Simulation Results

A scenario that exists in peer-to-peer network is used for simulation to verify the coding performance of the Wyner-Ziv coding scheme disclosed herein. In this scenario, peers may share images through the peer-to-peer network. Once an image is exposed through network, it could be processed arbitrarily by different methods such as transcoding, upsampling and downsampling. The decoder can obtain several versions with different quality levels from various peers. If the parity bits generated from the original are also transmitted, a version with high quality may be produced with multiple side information and Wyner-Ziv bits.

The first frame of Foreman sequence at QCIF format is used in a simulation. Four versions are generated as shown in TABLE 1. Their quality levels in terms of PSNR are also given. QP represents the quantization parameter in H.264 and represents quality parameter in JPEG and JPEG2000. The quality and the generating methods are unknown to the decoder.

TABLE 1

Generating methods and quality levels of various side information

| Side Info | Generating Methods | Quality (dB) |
|---|---|---|
| SIDE 1 | H.264 (QP = 30) | 35.66 |
| SIDE 2 | H.264 (QP = 32)→ JPEG (QP = 66) | 32.59 |
| SIDE 3 | JPEG (QP = 50) | 34.18 |
| SIDE 4 | JPEG2000 (QP = 66)→ Downsampling (½ × ½)→ Upsampling (2 × 2) | 29.64 |

First simulated is the case where only single Wyner-Ziv bit stream is received and no error occurs. TABLE 2 gives the performance of Wyner-Ziv coding with single side information in terms of both the number of parity bits (NOB) and the quality of reconstruction (REC).

TABLE 2

The performance of Wyner-Ziv coding using single side information

| Side Info | NOB | REC (dB) |
|---|---|---|
| SIDE 1 | 22176 | 37.91 |
| SIDE 2 | 31680 | 36.38 |
| SIDE 3 | 26928 | 37.39 |
| SIDE 4 | 39600 | 35.77 |

TABLE 3 shows the performance of the presently disclosed Wyner-Ziv coding system with multiple side information available. For all combinations of side information, the disclosed system is compared with Wyner-Ziv coding adopting the averaged copy as the single side information. The quality of the averaged copy is also provided. As shown in TABLE 1 and TABLE 2, using the averaged copy is generally better than using the worst copy alone, but not always better than utilizing the best one. In contrast, the multiple side information scheme disclosed herein outperforms either using averaged copy or selecting any individual one.

TABLE 3

The comparison between the multiple side information Wyner-Ziv scheme and Wyner-Ziv coding using averaged copy as single side information (AVE method)

| | AVE method | | | Multiple Side Information | | |
|---|---|---|---|---|---|---|
| Side Info | Averaged Copy (dB) | NOB | REC (dB) | NOB | REC (dB) | Percentage of Saved bits(%) |
| SIDE 1&2 | 35.34 | 23760 | 37.85 | 22176 | 37.83 | 6.67 |
| SIDE 1&3 | 36.82 | 20592 | 38.84 | 19008 | 38.84 | 7.69 |
| SIDE 1&4 | 33.72 | 28512 | 37.32 | 23760 | 37.14 | 16.67 |
| SIDE 2&3 | 34.61 | 25344 | 37.67 | 23760 | 37.65 | 6.25 |
| SIDE 2&4 | 32.52 | 31680 | 36.70 | 30096 | 36.62 | 5.00 |
| SIDE 3&4 | 33.32 | 30096 | 37.09 | 26928 | 36.99 | 10.52 |
| SIDE 1&2&3 | 36.22 | 20592 | 38.54 | 20592 | 38.54 | 0 |
| SIDE 1&2&4 | 35.35 | 23760 | 38.21 | 20592 | 38.08 | 13.33 |
| SIDE 1&3&4 | 34.55 | 26928 | 37.72 | 22176 | 37.62 | 17.65 |
| SIDE 2&3&4 | 34.19 | 26928 | 37.58 | 23760 | 37.44 | 11.76 |
| SIDE 1&2&3&4 | 35.47 | 23760 | 38.28 | 20592 | 38.20 | 13.33 |

The model for multiple parity bit streams when the decoder receives multiple streams with some corrupted parity bits is also tested. It is observed that the multiple side information Wyner-Ziv coding scheme can correct the errors automatically by just requiring a few more bits.

Furthermore, the Wyner-Ziv video coding scheme of FIG. 7 is implemented to verify the coding efficiency. Two sequences Foreman and Akyio in QCIF format with 30 frames per second are used in the test. The key frames (intra frames) are encoded with H.263 intra coding and decoded independently at the decoder to generate temporal side information. The implementation uses a symmetric motion estimation algorithm which interpolates two adjacent decoded frames to generate the temporal side information. In some areas with non-linear motion, the temporal side information may not be accurate, and the Wyner-Ziv bits can be used to compensate for the loss.

The coding performance of the disclosed scheme is compared with Wyner-Ziv coding in pixel domain proposed in Girod, et al., "Distributed Video Coding", Proc. IEEE, vol. 93, no. 1, January 2005, which is sometimes seen as a benchmark of Wyner-Ziv video coding. The disclosed scheme achieves around 1 dB gain in terms of rate-distortion performance. The exploitation of spatial correlation improves the overall coding performance of Wyner-Ziv video coding.

The disclosed Wyner-Ziv video coding scheme of FIG. 7 is also compared with the Wyner-Ziv coding using wavelet. It is observed that the disclosed scheme can achieve comparable coding performance to the method that removes the spatial redundancy by performing wavelet transform at the encoder. The test results show that the spatial correlation may be exploited at the decoder only, so that the complexity of encoding system may stay the same as that of a pixel-domain Wyner-Ziv encoding system which does not explore the spatial correlation (and is therefore simpler than one that does).

CONCLUSION

A practical Wyner-Ziv video coding system is disclosed, in which multiple side information, such as both temporal and spatial side information, are exploited for improving coding efficiency using a probability model based on multiple side information and optionally also multiple parity bit streams at the decoder. The spatial correlation can be exploited only at the decoder instead of being transformed at the encoder side. As a result, the exploitation of correlation only employs the decoder, adding no complexity burden to the encoder.

It is appreciated that the potential benefits and advantages discussed herein are not to be construed as a limitation or restriction to the scope of the appended claims.

Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims.

What is claimed is:

1. A method for video decoding performed by one or more processors configured with computer-executable instructions, the method comprising:
receiving coded Wyner-Ziv bits of a Wyner-Ziv frame of a source video content;
receiving multiple side information including at least a first side information and a second side information; and
decoding the coded Wyner-Ziv bits in view of the first side information and the second side information, the first side information and the second side information each contributing to the decoding at least partially separately, the decoding comprising:
computing a conditional probability associated with a decoding path interval, the first side information and the second side information each contributing to the conditional probability at least partially separately, the computing the conditional probability associated with the decoding path interval comprises computing a transitional probability associated with a transition from a first state to a second state.

2. The method of claim 1, wherein the first side information is generated from a first information domain, and the second side information is generated from a second information domain which is substantially different from the first information domain.

3. The method of claim 2, wherein the first information domain is temporal in which the first side information is generated temporally by interpolating a decoded reference frame adjacent to the Wyner-Ziv frame being decoded; and wherein the second information domain is spatial in which the second side information is generated from a decoded neighboring spatial portion in the Wyner-Ziv frame being decoded.

4. The method of claim 1, the method being implemented in a multi-view video coding system, wherein each Wyner-Ziv frame comprises a plurality of sub-view frames, the first side information being generated from a first one of the plurality of sub-view frames of the Wyner-Ziv frame being decoded, and the second side information being generated from a second one of the plurality of sub-view frames of the Wyner-Ziv frame being decoded.

5. The method of claim 1, the method being implemented in a multi-view video coding system, wherein each Wyner-Ziv frame comprises a plurality of sub-view frames, the first side information being generated temporally by interpolating a decoded reference frame adjacent to the Wyner-Ziv frame being decoded, and the second side information being generated from one of the plurality of sub-view frames of the Wyner-Ziv frame being decoded.

6. The method of claim 1, wherein the computing the conditional probability associated with the decoding path interval comprises computing the transitional probability associated with the transition from the first state represented by state s' to the second state represented by state s as follows:

$$P(j, u_i \mid Y(i), C(i)) = P(u_i \mid c_i) \sum_{t=1}^{k} P(j \mid y_i^t)$$

where $Y(i)$ is the multiple side information received by the decoder at an instant i; $C(i)$ is a parity bit set obtainable by the decoder at the instant i; j is an input signal at the decoder at the instant i; $u_t$ is an output parity bit of the transition from state s' to state s with the input signal j, $y_i^t$ is a tth symbol of k symbols of the multiple side information at the instant i (k being an integer $\geq 2$, representing a number of side information sets in the multiple side information $Y(i)$); and $c_i$ is a parity bit of the parity bit set $C(i)$ obtained at the instant i.

7. The method of claim 1, wherein the computing the conditional probability associated with the decoding path interval comprises receiving multiple streams of parity bits, each stream of parity bits corresponding to a respective one of the multiple side information, and each stream of parity bits contributing to the conditional probability in decoding the coded Wyner-Ziv bits.

8. The method of claim 1, wherein the computing the conditional probability associated with the decoding path interval comprises computing the transitional probability associated with the transition from the first state represented by state s' to the second state represented by state s as follows:

$$P(j, u_i \mid Y(i), C(i)) = \sum_{t=1}^{k} P(j \mid y_i^t) P(u_i \mid c_i^t)$$

where $Y(i)$ is the multiple side information received by the decoder at an instant i; $C(i)$ is a parity bit set obtainable by the decoder at the instant i; j is an input signal at the decoder at the instant i; $u_t$ is an output parity bit of the transition from state s' to state s with the input signal j, $y_i^t$ is a tth symbol of k symbols of the multiple side information at the instant i (k being an integer $\geq 2$, representing a number of side information sets in the multiple side information $Y(i)$); and $c_i^t$ is a tth parity bit of the parity bit set $C(i)$ obtained at the instant i.

9. The method of claim 1, wherein the decoding the coded Wyner-Ziv bits is carried out by a turbo decoder operating onto a k-dimensional signal set using a k-dimensional trellis coding scheme, k being an integer $\geq 2$, representing a number of side information sets in the multiple side information.

10. The method of claim 1, wherein the coded Wyner-Ziv bits are encoded in at least one of the following domains: pixel domain, discrete cosine transform (DCT) domain, and wavelet domain.

11. The method of claim 1, the method being implemented in a multiple description coding system, wherein the source video content is divided into a plurality of sub-stream descriptions each sent to a separate channel for decoding, at least one of the first side information and the second side information being generated from one of the plurality of sub-stream descriptions decoded.

12. The method of claim 1, the method being implemented in a multiple description coding system, wherein the source video content is divided into a plurality of sub-stream descriptions each sent to a separate channel for decoding, the first side information being generated from a first one of the plurality of sub-stream descriptions decoded, and the second side information being generated from a second one of the plurality of sub-stream descriptions decoded.

13. The method of claim 1, the method being implemented in a multiple description coding system, wherein the source video content is divided into a plurality of sub-stream descriptions each sent to a separate channel for decoding, the first side information being generated temporally by interpolating a decoded reference frame adjacent to the Wyner-Ziv frame being decoded, and the second side information being generated from one of the plurality of sub-stream descriptions decoded.

14. The method of claim 1, the method being implemented in a distributed video coding system with spatial sub-sampling, wherein the source video content comprises a spatially sub-sampled layer sent to a separate channel for decoding, at least one of the first side information and the second side information being generated from the spatially sub-sampled layer decoded.

15. The method of claim 1, the method being implemented in a distributed video coding system with spatial sub-sampling, wherein the source video content comprises a spatially sub-sampled layer sent to a separate channel for decoding, the first side information being generated temporally by interpolating a decoded reference frame adjacent to the Wyner-Ziv frame being decoded, and the second side information being generated from the spatially sub-sampled layer decoded.

16. A method for video coding, performed by one or more processors configured with computer-executable instructions, the method comprising:
encoding and decoding a key frame of a source video content;
encoding bits of a Wyner-Ziv frame of the source video content;
communicating the encoded Wyner-Ziv bits to a decoder for decoding;
providing a first side information and a second side information to the decoder;
decoding, by the decoder, the encoded bits of the Wyner-Ziv frame by computing a conditional probability associated with a decoding path interval, the first side information and the second side information each contributing to the conditional probability at least partially separately, the computing the conditional probability associated with the decoding path interval comprises computing a transitional probability associated with a transition from a first state to a second state; and reconstructing the Wyner-Ziv frame by using the decoded Wyner-Ziv bits for user presentation with the decoded key frame.

17. The method of claim 16, the method being implemented in a distributed video coding system.

18. A memory having stored therein computer-executable instructions executable by a processor that, when executed by the processor, cause the processor to perform operations comprising:

receiving coded Wyner-Ziv bits of a Wyner-Ziv frame of a source video content;

receiving multiple side information including at least a first side information and a second side information; and decoding the coded Wyner-Ziv bits in view of the first side information and the second side information, the first side information and the second side information each contributing to the decoding at least partially separately, the decoding comprising:

computing a conditional probability associated with a decoding path interval, the first side information and the second side information each contributing to the conditional probability at least partially separately, the computing the conditional probability associated with the decoding path interval comprises computing a transitional probability associated with a transition from a first state to a second state.

19. The memory of claim 18, wherein the first side information is generated from a first one of the plurality of sub-stream descriptions decoded, and the second side information is generated from a second one of the plurality of sub-stream descriptions decoded.

20. The memory of claim 18, wherein the first side information is generated temporally by interpolating a decoded reference frame adjacent to the Wyner-Ziv frame being decoded, and the second side information is generated from one of the plurality of sub-stream descriptions decoded.

* * * * *